United States Patent [19]

Ahmad et al.

[11] Patent Number: 5,209,817

[45] Date of Patent: May 11, 1993

[54] SELECTIVE PLATING METHOD FOR FORMING INTEGRAL VIA AND WIRING LAYERS

[75] Inventors: Umar M. Ahmad, Hopewell Junction; Daniel G. Berger, Poughkeepsie; Ananda Kumar, Hopewell Junction; Susan J. LaMaire, Yorktown Heights; Keshav B. Prasad, New Paltz; Sudipta K. Ray, Wappingers Falls; Kwong H. Wong, Croton-On-Hudson, all of N.Y.

[73] Assignee: International Business Machines Corporation, Armonk, N.Y.

[21] Appl. No.: 748,445

[22] Filed: Aug. 22, 1991

[51] Int. Cl.⁵ .................. B44C 1/22; B29C 37/00; C23F 1/00

[52] U.S. Cl. ..................... 156/643; 156/644; 156/655; 156/656; 156/659.1; 156/668; 205/125

[58] Field of Search ............... 156/643, 644, 655, 656, 156/659.1, 668; 29/852, 874, 876, 884; 361/417, 420, 425; 427/97; 204/15

[56] References Cited

U.S. PATENT DOCUMENTS

| | | | |
|---|---|---|---|
| 4,572,764 | 2/1986 | Fan | 156/630 |
| 4,631,111 | 12/1986 | Williston | 156/630 |
| 4,954,214 | 9/1990 | Ho | 156/628 |

OTHER PUBLICATIONS

IBM Technical Disclosure Bulletin, vol. 26, No. 3A; Aug. 1983; "Photosensitive Glass for Producing Recessed Metallurgy, Eliminating Need for Planarization"; R. R. Shaw & R. R. Tummala; p. 1094.

Primary Examiner—William A. Powell
Attorney, Agent, or Firm—Whitham & Marhoefer

[57] ABSTRACT

In a multi-level wiring structure wires and vias are formed by an isotropic deposition of a conductive material, such as copper, on a dielectric base, such as a polyimide. In a preferred embodiment of the invention copper is electroplated to a thin seed conducting layer deposited on the surface of the dielectric base in which via openings have been formed. Openings in a resist formed on the surface of the dielectric base over the seed layer forms a pattern defining the wiring and via conductor features. Electroplated copper fills the via openings and wire pattern openings in the resist isotropically so that the upper surfaces of the wiring and vias are co-planar when the plating step is complete. In adding subsequent wiring levels, the resist is removed and the via conductor and wiring pattern covered with another dielectric layer which both encapsulates the conductors of the previous layer and serves as the base for the next level which is formed in the same manner as the previous level.

10 Claims, 3 Drawing Sheets

SELECTIVE PLATING METHOD FOR FORMING INTEGRAL VIA AND WIRING LAYERS

DESCRIPTION

Background of the Invention

1. Field of the Invention

The present invention generally relates to multi-level wiring structures, and more particularly to an improved plating method in which vias and wiring are formed as a single composite level.

2. Description of the Prior Art

Multi-level wiring structures are needed in device and packaging technologies to improve product performance by minimizing the wiring lengths and hence transmission delays. In such structures, the different wiring levels are separated by a dielectric material, generally a polymer such as a polyimide, and interconnections between the wiring levels are provided by metallized vias through the polymeric insulation. Wiring levels are fabricated using conventional thin-film process such as vacuum deposition, and patterning of the deposited metal using lithographically produced stencils or resist masks.

The most common approach to fabricating such multi-layer wiring structures is to form the individual layers in sequence (i.e., a via layer - wiring layer - via layer - wiring layer, etc). A considerable simplification of the overall process for such structures could be obtained by forming a composite via-wiring level as a single unit.

U.S. Pat. No. 4,631,111, entitled "Dichromic Process for Preparation of Conductive Circuit", and U.S. Pat. No. 4,572,764, entitled "Preparation of Photoformed Plastic Multistrate by Via Formation First" have generally similar disclosures of a process in which vias and wiring patterns are formed by electroless plating of copper on a seed layer. IBM Technical Disclosure Bulletin, Vol. 26, No. 3A dated August 1983, entitled "Photosensitive Glass for Processing Recessed Mettallurgy, Eliminating Need for Planarization" discloses a method in which copper is blanket coated to a seed layer to form vias and wiring.

SUMMARY OF THE INVENTION

One object of this invention is the provision of a method constructing vias and wiring in a single composite level without the need for critical surface planarization of the metallized layer; a method which produces so-called leveled via or via studs in which the upper surface of the via stud is self-leveled with the wiring features. Leveled vias or a 'via studs' have the advantage over the conformal vias in multilevel, high-density wiring structures because they allow vias of the successive levels to be stacked one over the other while the latter require staggered via stacking which constricts the wiring channels between the vias in the wiring planes.

Another object of the invention is the provision of a method which does not require the use of a photosensitive polyimide base material, thus allowing the use of a polyimide base material best suited for the intended application.

Briefly, this invention contemplates the provision of a multi-level wiring structure in which wires and vias are formed by an isotropic deposition of a conductive material, such as copper, on a dielectric base, such as a polyimide. In a preferred embodiment of the invention copper is electroplated to a thin seed conducting layer deposited on the surface of the dielectric base in which via openings have been formed. Openings in a resist formed on the surface of the dielectric base over the seed layer forms a pattern defining the wiring and via conductor features. Electroplated copper fills the via openings and wire pattern openings in the resist isotropically so that the upper surfaces of the wiring and vias are co-planar when the plating step is complete. In adding subsequent wiring levels, the resist is removed and the via conductor and wiring pattern covered with another dielectric layer which both encapsulates the conductors of the previous layer and serves as the base for the next level which is formed in the same manner as the previous level.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
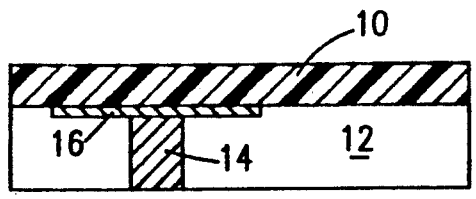
FIGS. 1 through 9 illustrate successive steps in one exemplary process for forming an integral via and wiring level in accordance with the teachings of this invention.

Referring now to FIG. 1, in a first example of an embodiment of the invention, a layer 10 of a photosensitive polyimide, such as Ciba-Geigy 412, is formed by a conventional spin process on the surface of a base 12. The layer 10 is on the order of 6 $\mu$m to 8 $\mu$m thick. The base 12 is comprised of a suitable material for the intended application, such as a glass, a ceramic, a semiconductor, or a polymer material. In a typical application, the base 12 includes a via conductor 14 and a capture pad 16.

Figure 2:
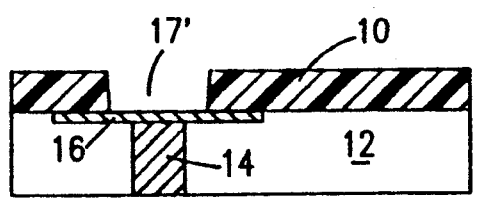

The via pattern is exposed on the surface of the photosensitive polyimide layer 10 and the exposed regions developed and removed using conventional processes such as a wet or dry etch process to form via openings in the layer 10 as illustrated in FIG. 2. The polyimide layer is then fully cured to the point where it is no longer photosensitive.

Figure 3:
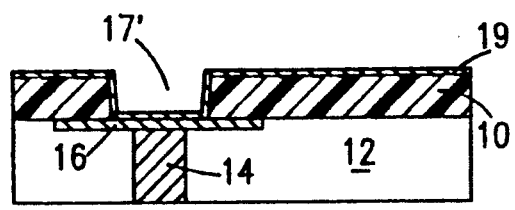
Figure 4:
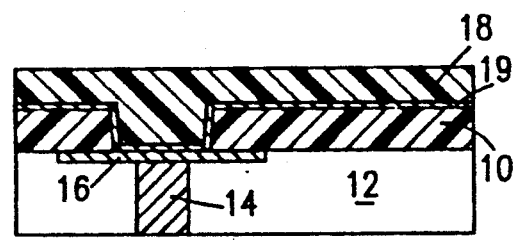
Figure 5:
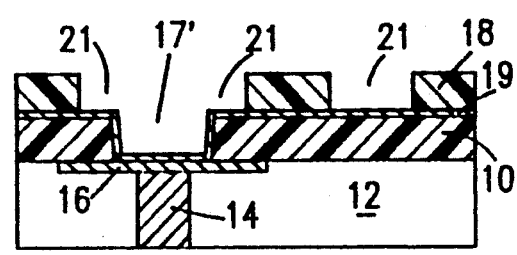

Next, as illustrated in FIG. 3, a plating seed layer 19 consisting of chromium (Cr) (100–500 Angstroms) and copper (Cu) (about 5000 Angstroms) is sputtered onto the structure illustrated in FIG. 2. A second layer of photosensitive polyimide 18 on the order of 3 $\mu$m to 7 $\mu$m thick is then spun onto the surface of the seed layer, as illustrated in FIG. 4. Using conventional techniques a wiring and via pattern is exposed and developed in the layer 18 and the undeveloped portions removed, forming openings in layer 18 for vias 17' and wires 21, as illustrated in FIG. 5. Here it should be noted that the remaining portions of layer 18 are not further developed so that they can be easily dissolved and thus removed after the wire and via conductors have been formed. It should also be noted that the pattern could be formed by one of the well known photoresist processes of the type commonly used in the manufacture of semiconductors.

The seed layer 16 covers dielectric layer 10 and the walls of the via openings and serves as an electrode onto which copper is electroplated to form the via and wiring conductors at this level. It will be appreciated that the electroplated copper deposits isotropically on the exposed portions of the seed layer 18 so the via and wiring channels fill with upper surfaces of the via and wiring features planarized when the electroplating process is complete. It will be appreciated that since the electroplated copper deposits isotropically, the copper layer along the walls of the via thickens with time to the same extent as the copper layer on the planar surfaces of the base of the via and wiring channel. As the plating continues the thickening of the via walls eventually leads to a situation when the walls coalesce and level out to form a via stud. From simple geometric considerations it is clear that this should occur when the plating thickness approximates half the via diameter.

The factors that govern this leveling of the plated copper at the via locations are the via diameter, its depth, wall angle and the thickness of the plated copper. The latter has to be such that it should be in regime that the required electrical characteristics of the package can tolerate. The choice of the via diameter in the wiring structure is not arbitrary. Rather, it is generally governed by two considerations in high-density packaging. The first is that the via diameter should be about the same size as the width of the thin film wiring attached to it so that the allowable wiring pitch is not made coarser than necessary. The second consideration is that the cross-section area of the via be about the same as the cross-sectional area of the conductor wires. These two considerations together lead to defining the thickness of the copper plating required as equal to the via diameter. From the foregoing it is clear that this plating thickness is nearly twice that required for via leveling. In high-density wiring structures of this example, the thin film line are typically 5-25 microns (micrometers) wide, 5-25 microns thick and via diameters also on the order of 5-25 microns. The polyimide dielectric thickness is also in the same range.

In the plating step, the most important aspect to promote isotropic deposition in order to achieve self-leveling at the via locations. The electrolytic plating is carried out using commercially available copper plating solutions such as Selrox Copper bath (Selerex Corp.) which contains copper sulphate as the main plating salt along with ingredients for controlling the nature of the copper deposit. The plating current employed ranges between 20-30 micro ampers/sq. cm (ma/cm$^2$). Pulse plating with additive-free copper baths is also very effective to promote isotropic deposition. Typically the additive-free baths contain 0.5-1.0 M copper sulphate and 0.5-1.0 M sulphuric acid. Pulse plating currents of 50-200 ma/cm$^2$ are employed, with a pulse on duration of 2-10 millisecs and off duration of 7-40 millisecs. Powerful but smooth agitation keeps the diffusion layer thickness small. Paddle cells were employed to obtain such agitation.

Figure 6:
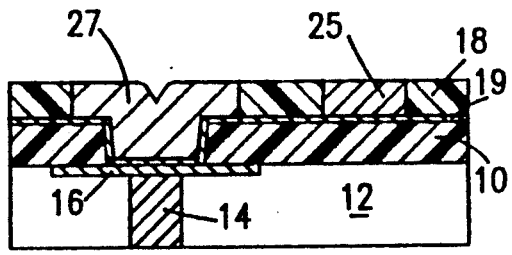

FIG. 6 illustrates the structure when the copper plating step is complete forming a wiring feature 25 and a via feature 27.

Figure 7:
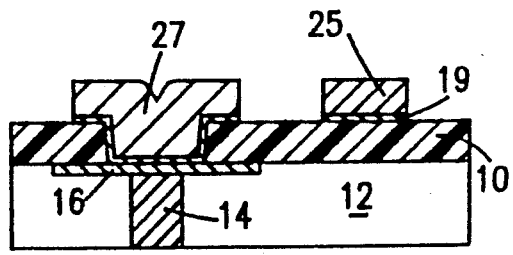
Figure 8:
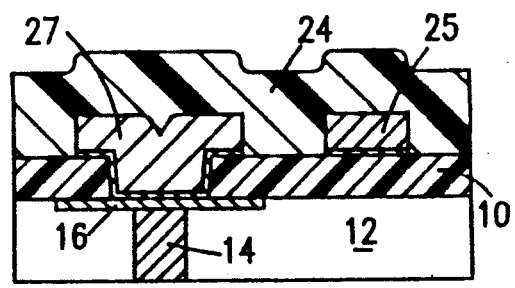

Following the deposition of copper, the polyimide layer 18 is dissolved in a suitable solvent to expose the seed layer 19, and the thin seed layer 19 is removed, for example by a process of flash etching. The structure at this point in the process is illustrated in FIG. 7.

Figure 9:
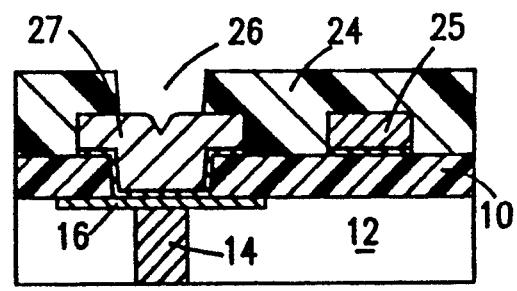

A photosensitive polyimide layer 24 similar to layer 10, is spun on the assembly, FIG. 9. The layer 24 should be sufficiently thick to provide an adequate dielectric insulator over the copper features; about 5 μm over the upper planar surface of the copper. Dielectric layer 24 completely encloses the copper circuit features and provides a generally plane surface for the next wiring and via level. Via openings 26 (FIG. 9) are then etched in this layer 24 by the expose and develop process used to form the via openings in the layer 10, and the layer is then fully cured. At this point, one via and wiring level is complete and the second layer has been started; the process is repeated to fabricate the desired number of wiring levels. In this first exemplary embodiment of the invention, there is no need for planarizing and the structure is built using photosensitive polyimide. The structure, however, tends to be conformal, not completely planar; a situation which may be satisfactory for structures of one or two levels. For more than two levels, the non-planarity may be unsatisfactory. The following second exemplary embodiment of the invention provides greater planarity and other advantages.

Figure 10:
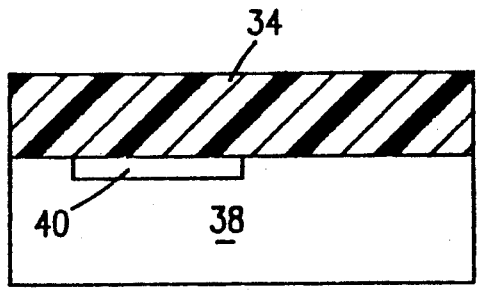
FIGS. 10 through 17 illustrate the successive steps for another example of the invention.
Figure 11:
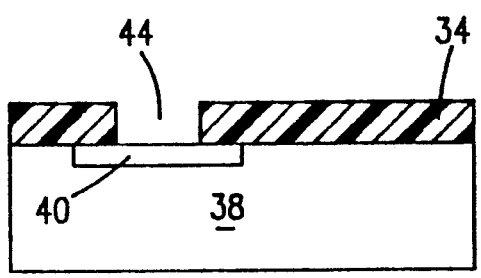
Figure 12:
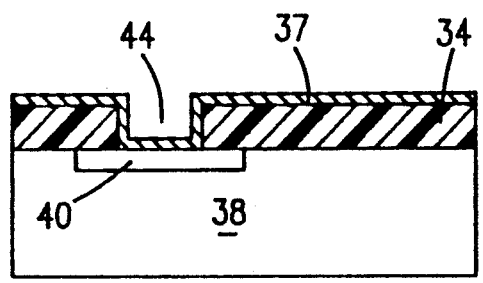

Referring now to FIG. 10, in this embodiment of the invention, a relatively thick (e.g., about 20 μm) layer 34 of a suitable polyimide, such as for example BPDA-PDA is spun onto a base 38 which includes a capture pad 40. This embodiment is illustrated with respect to fabricating a multi-level thin film structure using a non-photosensitive polyimide such as BPDA-PDA (sold by DuPont Corporation and others). This material has excellent mechanical properties, low thermal expansivity and more impermeability to moisture than are photosensitive polyimides. The reason for first coating about 20 microns and then planarizing it down to the required final thickness is to neutralize any non-planarity in the underlying substrate (silicon, alumina ceramic or glass-ceramic). Thereafter, subsequent layers are planarized with reference to this first polyimide surface. The preferred planarization processes are chem-mech polishing and highly accurate machining techniques. These planarization techniques have been disclosed in U.S. Pat. Nos. 4,702,792 and 4,954,142, Nenadio et al., U.S. patent application Ser. No. 481,941, filed Feb. 23, 1990, U.S. Pat. No. 5,084,071 and Park et al., U.S. patent application Ser. No. 399,058, filed Aug. 28, 1989, U.S. Pat. No. 5,122,439. The layer 34, which need not be photosensitive, is fully cured and then planarized to a suitable thickness to provide dielectric isolation, about 6-8 μm. Via openings 44 are formed in the layer 34 by laser ablation techniques (FIG. 11) and seed layer 32 of Cr (200 A) and Cu 0.5 μm) is sputtered onto the planarized surface to serve as an electrode for the electroplating of via and wiring conducting layer. FIG. 12 shows the assembly at this stage with the seed layer 32 in place.

Figure 14:
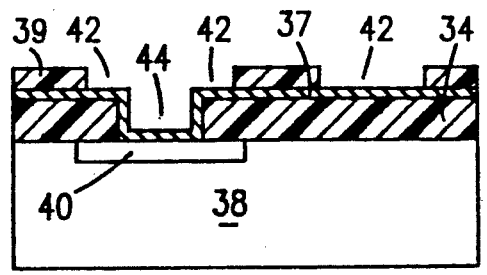
Figure 13:
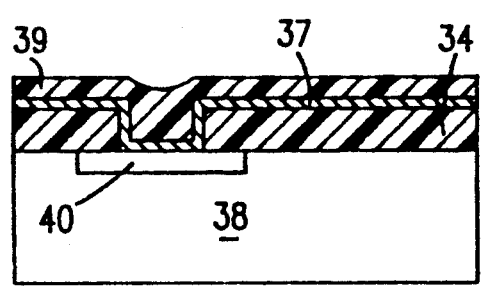

Next, a suitable layer of resist 39 is spun on the surface of the assembly (see FIG. 13) and an image of the intended wiring and via features is exposed and developed in this resist layer in alignment with previously etched via openings. A negative acting photosensitive polyimide such as Ciba-Geigy 412 resist is particularly well suited for forming the layer 39. FIG. 14 illustrates the process at the point with the developed portions of the resist removed, exposing the vias and forming wiring pattern troughs 42 in the resist layer 39.

Figure 15:
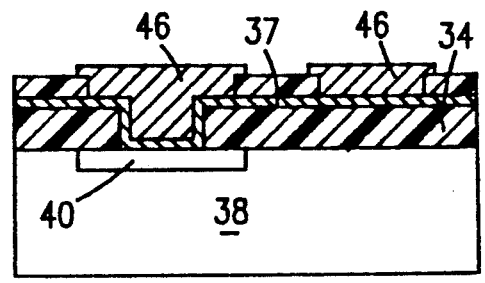

Using the exposed (chromium-copper) CrCu seed layer 32 as an electrode, copper 46 is electroplated through the developed openings in the resist layer 39, FIG. 15 illustrates this stage of the process. The copper plates isotropically and the thickness of the copper layer needed to attain a planar upper copper surface can be determined by a calculation based upon the via and wiring pattern dimensions as explained above.

It should be noted that the upper surface of the copper layer becomes planar at thickness that is significantly less than the combined depths of the via layer and the wiring layer. The structure at the completion of the copper electroplating step is shown in FIG. 15.

Figure 16:
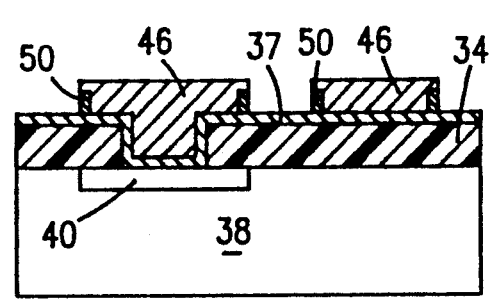

The next step is to strip the resist layer 39 to expose the CrCu seed layer 37. The layer 39 can be stripped conveniently by use of a solvent suitable for the particular resist. Alternatively, the resist layer can be removed by ashing or reactive ion etching in oxygen. FIG. 16 illustrates this point in the process, using a reactive ion etching in oxygen. Here it should be noted that once the thickness of the plated copper layer 46 exceeds the thickness of the resist layer 39, the plated copper will grow laterally to the same extent that it grows vertically; in this illustrated example, the copper spreads about 3 μm on each side of a feature. When a directional etching step to remove the resist is completed, a sleeve 50 of resist remains around the plated features, as shown in FIG. 16. This resist sleeve prevents lateral etching of the copper features when the CrCu seed layer 37 is removed. If the selected material for the resist layer 39 is a photosensitive polyimide, the resist sleeve 50 need not be removed. This is advantageous in that it aids in providing a void-free coating when the next layer of polyimide is applied. In the event it is desirable to remove the sleeve 50, it can be removed by a suitable solvent after the CrCu seed layer 37 is removed.

Figure 17:
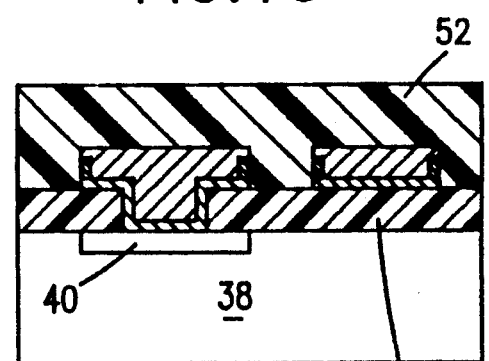
Figure 18:
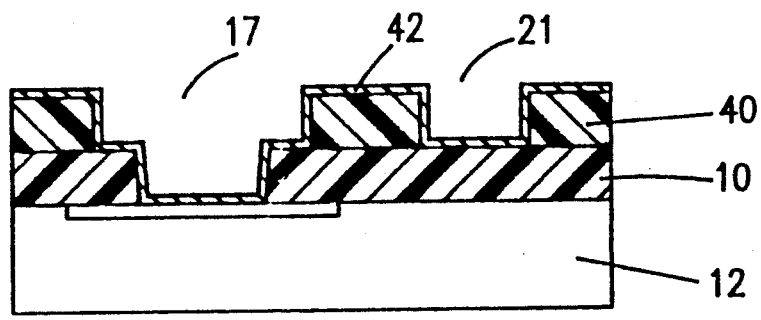
FIGS. 18 through 21 illustrate an alternative embodiment of the invention.

Once the resist has been removed, the CrCu seed layer 37 is removed by flash etching; with 100% over etching, the copper feature thickness will be reduced by only about 1 μm and the width by about 2 μm. A relatively thick layer 52 of the same polyimide chosen for layer 34 is spun onto the assembly, for example the initial thickness of the layer 52 would be on the order of 20-25 μm. This layer is cured and then planarized to provide a layer 52 (FIG. 17) of polyimide of a desired thickness to provide dielectric interlevel feature separation with a planar upper surface. Vias openings are formed in the layer 52 by, for example, laser ablation, and the above described process steps are repeated to form this next composite via and wiring level. The polyimide layer 52 not only encapsulates the previous wiring level but also forms the interlevel dielectric between layers.

Although the invention thus far described relates to a preferred method of isotropically depositing the conductor features by electroplating, another embodiment of the invention contemplates an implementation in which the conductor features are deposited by electroless plating, which also deposits metal isotropically thereby providing a geometric leveling of the conductive features. In an electroless plating embodiment of the invention as in the foregoing electroplating embodiments, the seed electrode is deposited below the top surface of the resist layer. However, electroless plating does not require a continuous electrode since a potential is not applied to the electrode and the seed layer can be deposited after the resist layer is formed.

Referring now to FIGS. 18 through 21, FIG. 18 shows a substrate 12 with a dielectric layer 10 as in the previous embodiment of the invention. A resist layer 40 has wiring and via features openings 17 and 21 formed therein. Preferably, the layer 40 is a photosensitive polyimide and the openings can be formed by well known process steps including those previously described. In this embodiment of the invention, a CrCu seed layer 42 is formed on the exposed wiring and via opening surfaces and the upper surface of the resist layer as well by sputtering after the wire and via pattern openings have been formed.

Figure 19:
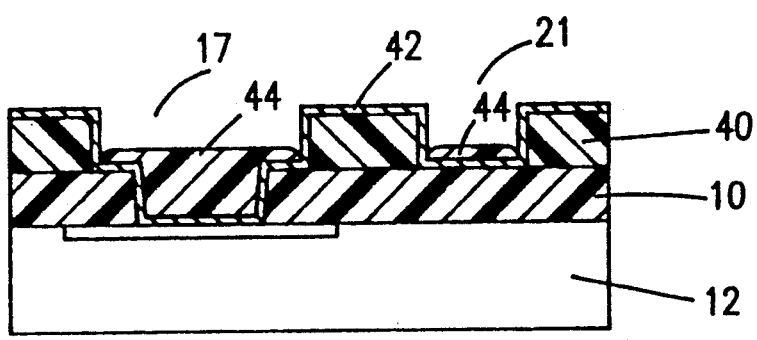
Figure 20:
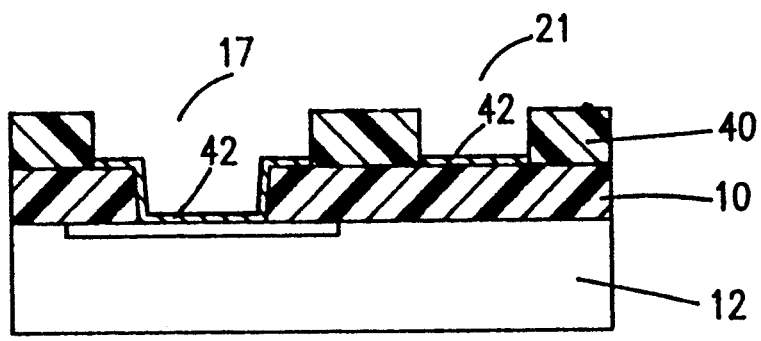

Next, as illustrated in FIG. 19, a suitable resist element layer 44 deposited in the via and wiring openings. The seed layer 42 unprotected by resist is removed, by flash etching, for example. FIG. 20 illustrates this point in the process. The sub-etch resist is then removed using a suitable solvent.

Figure 21:
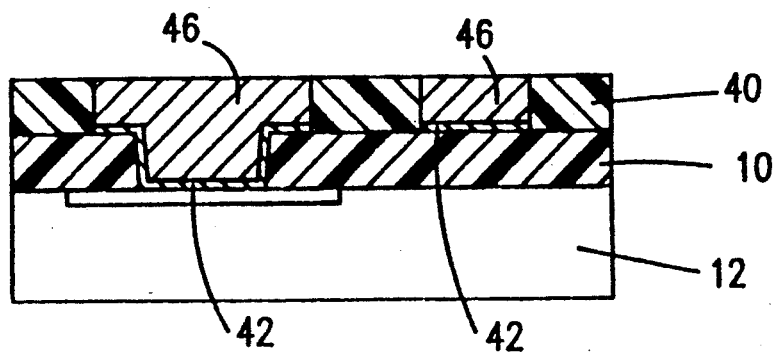

Next, conductive features are isotropically deposited by electroless plating of copper features 46 to a depth sufficient to planarize the upper surface of these features, a depth of about 8 μm. The seed layer remaining in the via and the wiring channels are first activated using a palladium salt solution prior to electroless copper plating. Note that since the seed layer has been etched off from the vertical walls of wiring channel plating can only fill these from bottom up. This is important because of the need to avoid copper spikes forming at the edges of these features if the seed layer had not been etched away in the previous step. Electroless copper plating can be carried out with baths containing copper sulphate and employing formaldehyde as the reducing agent. The bath also contains certain amines and complexing agents. The baths are adjusted to have a pH of 11 using sodium hydroxide additions. Some agitation is required to obtain isotropic deposition. FIG. 21 shows the process at this step. In this embodiment of the invention the polyimide layer 40 can be left in place with the metal feature 46 co-planar with the upper surface of polyimide layer 40, thus eliminating the need to planarize the next level of polyimide in forming a multi-level wiring pattern. While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of fabricating wiring and via conductors comprising:

forming a via opening in a dielectric layer extending from an upper surface of the dielectric layer through said dielectric layer with said dielectric layer forming a wall of said via;

forming a thin conductive seed layer over the upper surface of said dielectric layer and the wall defining said via opening;

forming a masking layer on said seed layer;

forming openings in said masking layer that expose said seed layer in the wall of the via opening and in a desired wiring pattern;

electroplating conductive material onto the exposed portions of said seed layer so that isotropic deposition of said conductive material fills said via opening in said dielectric layer with the upper surface of the conductive material that fills said via opening co-planar with the upper surface of the conductive material in said wiring pattern.

2. A method of fabricating wiring and via conductors comprising:

a. forming a via opening in a first dielectric layer extending from an upper surface of the dielectric layer through said dielectric layer with said dielectric layer forming a wall of said via;

b. forming a thin conductive seed layer over the upper surface of said dielectric layer and the wall defining said via opening;

c. forming a masking layer on said seed layer;

d. forming openings in said masking layer that expose said seed layer in the wall of the via opening and in a desired wiring pattern;

e. electroplating conductive material onto the exposed portions of said seed layer so that isotropic deposition of said conductive material fills said via opening in said dielectric layer with the upper surface of the conductive material that fills said via opening co-planar with the upper surface of the conductive material in said wiring pattern;

f. removing said dielectric masking layer; and g. coating the assembly of set forth in paragraph e with a second dielectric layer and repeating the steps a through e to form a second wiring and via conductive layer.

3. A method of fabricating wiring and via conductors as in claim 1 including the additional step of planarizing said dielectric layer.

4. A method of fabricating wiring and via conductors as in claim 2 including the further steps of planarizing said first dielectric layer and planarizing said second dielectric layer.

5. A method of fabricating wiring and via conductors as in claim 1 wherein said via opening has a diameter equal to approximately one-half the plating thickness.

6. A method of fabricating wiring and via conductors as in claim 2 wherein said via opening has a diameter equal to approximately one-half the plating thickness.

7. A method of fabricating wiring and via conductors as in claim 3 wherein said via opening has a diameter equal to approximately one-half the plating thickness.

8. A method of fabricating wiring and via conductors as in claim 4 wherein said via opening has a diameter equal to approximately one-half the plating thickness.

9. A method of fabricating wiring and via conductors comprising:

forming a via opening in a dielectric layer extending from an upper surface of the dielectric layer through said dielectric layer with said dielectric layer forming a wall of said via opening;

forming a wiring pattern opening in said dielectric layer extending from said upper surface of the dielectric layer through the dielectric layer with the dielectric layer forming a wall of said wiring pattern opening;

forming a thin conductive seed layer over the upper surface of said dielectric layer, over the via opening including the wall defining said via opening, and over the wiring pattern opening including the wall defining the wire pattern opening;

removing said conductive seed layer from said upper surface of said dielectric layer, from the wall defining said via opening, and from the wall defining said wire pattern opening;

electrolessly plating conductive material onto the remaining portions of said seed layer so that isotropic deposition of said conductive material fills said via opening and said wire pattern openings in said dielectric layer with the upper surface of the conductive material that fills said via opening co-planar with the upper surface of the conductive material that fills said wiring pattern openings.

10. A method of fabricating wiring and via conductors as in claim 6 wherein said via opening has a diameter equal to approximately one-half the plating thickness.

* * * * *